United States Patent
Ludikhuize

(12) 
(10) Patent No.: US 6,288,424 B1
(45) Date of Patent: Sep. 11, 2001

(54) SEMICONDUCTOR DEVICE HAVING LDMOS TRANSISTORS AND A SCREENING LAYER

(75) Inventor: Adrianus W. Ludikhuize, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/400,962

(22) Filed: Sep. 22, 1999

(30) Foreign Application Priority Data

Sep. 23, 1998 (EP) .................................................. 98203183

(51) Int. Cl.[7] .................................................. H01L 29/78
(52) U.S. Cl. .................... 257/335; 257/343; 257/345; 257/372; 257/373; 257/394; 257/395; 257/492; 257/544; 257/549; 438/282
(58) Field of Search .................................. 257/345, 372, 257/373, 394, 395, 335

(56) References Cited

U.S. PATENT DOCUMENTS 5,146,298 * 9/1992 Eklund .................................. 357/22
5,719,421 * 2/1998 Hutter et al. ..
6,020,617 * 2/2000 Jos ......................................... 257/401
6,107,661 * 8/2000 Okabe et al. ..

* cited by examiner

Primary Examiner—Nathan Flynn
Assistant Examiner—Kevin Quinto
(74) Attorney, Agent, or Firm—Steven R. Biren

(57) ABSTRACT

In important applications of circuits comprising transistors of the lateral DMOST type, such as (half) bridges, the voltage on the output may become higher or lower than the supply voltage or earth in the case of an inductive load. The injection of charge carriers into the substrate can be prevented by screening the drain (18) of the Low-Side transistor from the substrate by means of a p-type buried layer (13) and an n-type buried layer (14) below said p-type buried layer. In order to avoid parasitic npn-action between the n-type buried layer (14) and the n-type drain (18), not only the back-gate regions (16a, 16c) at the edge of the transistor, but also the back-gate regions (16b) in the center of the transistor, are connected to the p-type buried layer, for example by means of a p-type well. As a result, throughout the relatively high-ohmic buried layer, the potential is well defined, so that said npn-action is prevented.

6 Claims, 3 Drawing Sheets

SEMICONDUCTOR DEVICE HAVING LDMOS TRANSISTORS AND A SCREENING LAYER

BACKGROUND OF THE INVENTION

The invention relates to a semiconductor device with a transistor of the lateral DMOS type, comprising a semiconductor body having a semiconductor substrate of a first conductivity type and, provided on the substrate, an epitaxial semiconductor layer bordering on a surface of the semiconductor body, said semiconductor body being provided, at the interface between the epitaxial layer and the substrate, with a layered region of the first conductivity type and a buried layer of a second, opposite, conductivity type, which extends between the layered region and the substrate and electrically insulates them from each other, at least three, mutually separated backgate regions of the first conductivity type, which border on the surface and are each provided with a source region of the second conductivity type, and a number of drain zones in the form of heavily doped surface regions of the second conductivity type, situated between the backgate regions and separated from said backgate regions by intermediate slightly doped drain extensions of the second conductivity type, being formed in a part of the expitaxial layer, situated between the buried layer and the surface.

Such a device is known, inter alia, from the patent document U.S. Pat. No. 5,146,298.

Transistors of the lateral DMOS type, often referred to as LDMOST, are frequently used as a switch in power circuits for turning on and off large currents. A known circuit is, for example, a (half) bridge circuit by means of which an electric current can be sent through a load in two directions. In this circuit, two transistors, customarily of the n-channel type, are arranged in series between a high voltage and a low voltage, whereby the source of the one transistor, hereinafter referred to as low side transistor or LS transistor, is connected to the low voltage and the drain of the other transistor, hereinafter referred to as high side transistor or HS transistor, is connected to the high voltage, and the drain of the LS transistor and the source of the HS transistor are both connected to the load via the output. The gates of the transistors are connected to a control circuit by means of which the transistors can be alternately turned on and off, that is if one transistor is in the "on" state, the other transistor is in the "off" state. In these and other applications, the transistor is often subjected to an inductive load. As a result, if a transistor changes from the conducting "on" state to the non-conducting "off" state, it is possible, for example, in the case of the above-described bridge circuit, that the voltage on the output becomes higher than the high supply voltage or lower than the low supply voltage. Due to this, in embodiments where the drain of the LS transistor forms a pn-junction with the substrate, this pn-junction may become forward poled during operation and hence inject electrons into the substrate. This injection of minority charge carriers into the substrate can be precluded, or at least reduced substantially, in an LDMOST of the type described in the opening paragraph in which the drain of the LS transistor does not form a pn-junction with the substrate but, instead, with said p-type layered region which is electrically insulated by the n-type buried layer from the p-type substrate.

FIG. 4 of the above-mentioned patent U.S. Pat. No. 5,146,298 shows a structure with an n-type epi layer on a p-type substrate and a double buried layer, said layered region of the first conductivity type, which, in the example, is the p-type, is formed by a second buried layer which is electrically insulated from the substrate by the n-type buried layer. The p-type buried layer isolates the n-type buried layer from an island-shaped part of the n-type epitaxial layer in which the transistor is formed. The island is delimited by deep p-type insulation regions which are connected to the p-type buried layer and form an electrical connection of the buried layer. If, during operation, the voltage on the drain becomes lower than the low supply voltage, the pn-junction between the drain and the p-type buried layer may become forward poled instead of the pn-junction from the drain to the substrate, thus precluding injection into the substrate.

In practice it has however been found that in such a configuration new drawbacks may occur, in particular as the size of the transistor increases in connection with the current to be dealt with. For example, if there is a high positive voltage on the drain, it is possible that a vertical npn action occurs in which the drain serves as the collector, the buried p-type layer as the base and the buried n-type layer as the emitter. Such an npn action may also occur under dynamic conditions in the case of a large dV/dt on the drain. It is an object of the invention to provide, inter alia, a lateral DMOS transistor in which, apart from injection of minority carriers into the substrate, also npn action between the drain and the buried n-type layer is precluded. To achieve this, a semiconductor device of the type described in the opening paragraph is characterized in that the back-gate regions are each conductively connected to said layered region of the first conductivity type by means of a zone of the first conductivity type.

SUMMARY OF THE INVENTION

The invention is based, inter alia, on the recognition that the parasitic npn action is connected with the relatively high resistance of the p-type buried layer which forms the bases of the parasitic npn transistor. In the known device, the buried p-type layer is connected, via the p-type island isolation, to the edge of the island in which the transistor is formed. A consequence thereof is, for example, that particularly in the case of larger transistors, leakage currents in the center of the transistor must be removed via a large resistance, thereby generating a voltage drop causing the vertical npn action. By connecting the buried layer also in the center of the transistor, namely via the back-gate regions of the transistor, it is possible to reduce the resistance substantially and hence preclude, or at least substantially preclude parasitic npn action.

It is noted that said p-type layered region does not always have to be embodied so as to be a buried layer. In embodiments in which the epitaxial layer is, for example, of the same conductivity type as the substrate, the layered region may be formed, in the absence of the p-type buried layer, by the layered part of the epitaxial layer situated between the back-gate regions and the buried layer of the second conductivity type. In most embodiments, however, the above-mentioned layered region of the first conductivity type is formed by a buried layer provided at the interface between the epitaxial layer and the substrate. The use of two buried layers of different conductivity types offers advantages, irrespective of whether the epitaxial layer is of the n-type or the p-type.

An embodiment which is compatible with many standard CMOS or BICMOS processes is characterized in that the epitaxial layer is of the same, i.e. the first, conductivity type as the substrate and that the drain region includes a number of mutually separated slightly doped regions which each form a drain extension which extends substantially between adjoining back-gate regions of the first conductivity type, so that parts of the epitaxial layer between the back-gate regions and the buried layer of the first conductivity type remain which form a conductive connection between the back-gate regions and this buried layer. An embodiment which is compatible with many bipolar processes is characterized in that the epitaxial layer is of the second conductivity type, said part in which the transistor is formed being electrically insulated from the buried layer by the buried layer of the first conductivity type, and a doped region of the first conductivity type being provided between each of the back-gate regions and the buried layer of the first conductivity type, said doped region of the first conductivity type forming a conductive connection between the back-gate region and the buried layer of the first conductivity type.

An important application of an LDMOS transistor in accordance with the invention is an LS switching transistor in a (half) bridge circuit. A further embodiment of a semiconductor device in accordance with the invention is characterized in that the device includes a half bridge circuit with a first connection terminal for a high voltage and a second connection terminal for a low voltage, the source region of the transistor being connected to the connection terminal for the low voltage and the drain region of the transistor being connected to the output terminal and the source region of a second transistor whose drain region is connected to the first connection terminal.

BRIEF DESCRIPTION OF THE DRAWING

These and other aspects of the invention will be apparent from and elucidated with reference to the embodiments described hereinafter.

In the drawings.

Figure 1:
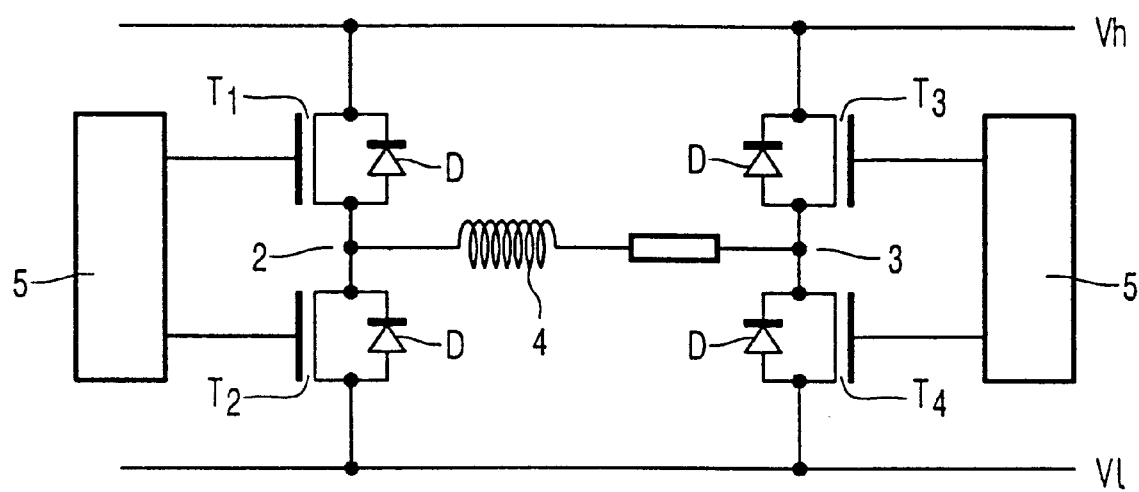
FIG. 1 shows an electrical diagram of a bridge circuit provided with a transistor in accordance with the invention.

It is noted that the drawing is diagrammatic and not drawn to scale, and that, for clarity, particularly the dimensions in the thickness direction are exaggerated with respect to the dimensions in the lateral direction.

DESCRIPTION OF THE PREFERRED EMBODIMENTS

In the diagram of FIG. 1, two connection terminals are shown, i.e. one connection terminal for a high voltage $V_h$ and the other one for a low voltage $V_l$. Said low voltage may be, for example, earth. The high voltage may have a value, for example, of several tens of volts. The circuit comprises a first half bridge in the form of a series arrangement of two n-channel DMOS transistors $T_1$ and $T_2$ between the connection terminals $V_h$ and $V_l$, the high voltage being applied to the drain of $T_1$, and the low voltage being applied to the source of $T_2$. The transistors $T_1$ and $T_2$ form, respectively, the above-mentioned HS (high side) transistor and LS (low side) transistor. The source of $T_1$ and the drain of $T_2$ are connected to the output 2 of the half bridge. In this example, the circuit comprises a second half bridge, including the HS transistor $T_3$, the LS transistor $T_4$ and the output 3, which in combination with the first half bridge constitutes a whole bridge circuit. The drawing also shows four diodes D which represent the pn-junctions between the back-gate regions and the drains of the transistors. The outputs 2 and 3 are connected to an inductive load 4, which, for the sake of simplicity, is represented in the drawing as an induction with a resistance. The gates of the transistors are connected to a control circuit 5 by means of which the transistors can be rendered alternatively conducting and non-conducting. During operation, for example, first the transistors $T_1$ and $T_4$ are put into the on-state, so that the current in the load 4 goes to the right. In a next phase, the transistors $T_1$ and $T_4$ are put into the off-state, and the transistors $T_2$ and $T_3$ are put into the on-state. As a result, the current in the load 4 goes to the left. In between both states, all transistors are in the off-state for a short period of time. By turning off the transistors $T_1$ and $T_4$, the voltage on the nodes 2 and 3 may, as a result of the inductive load, become lower than $V_l$ or higher than $V_h$, thus causing the back-gate diodes D of these transistors to be forward biased. As described hereinabove, it is desirable to construct the transistors in such a manner that adverse effects of these high or low voltages, such as charge injection into the substrate, are precluded. Charge may be injected into the substrate if the drain of $T_2$ forms a diode to the substrate and the substrate is connected to $V_l$.

Figure 2:
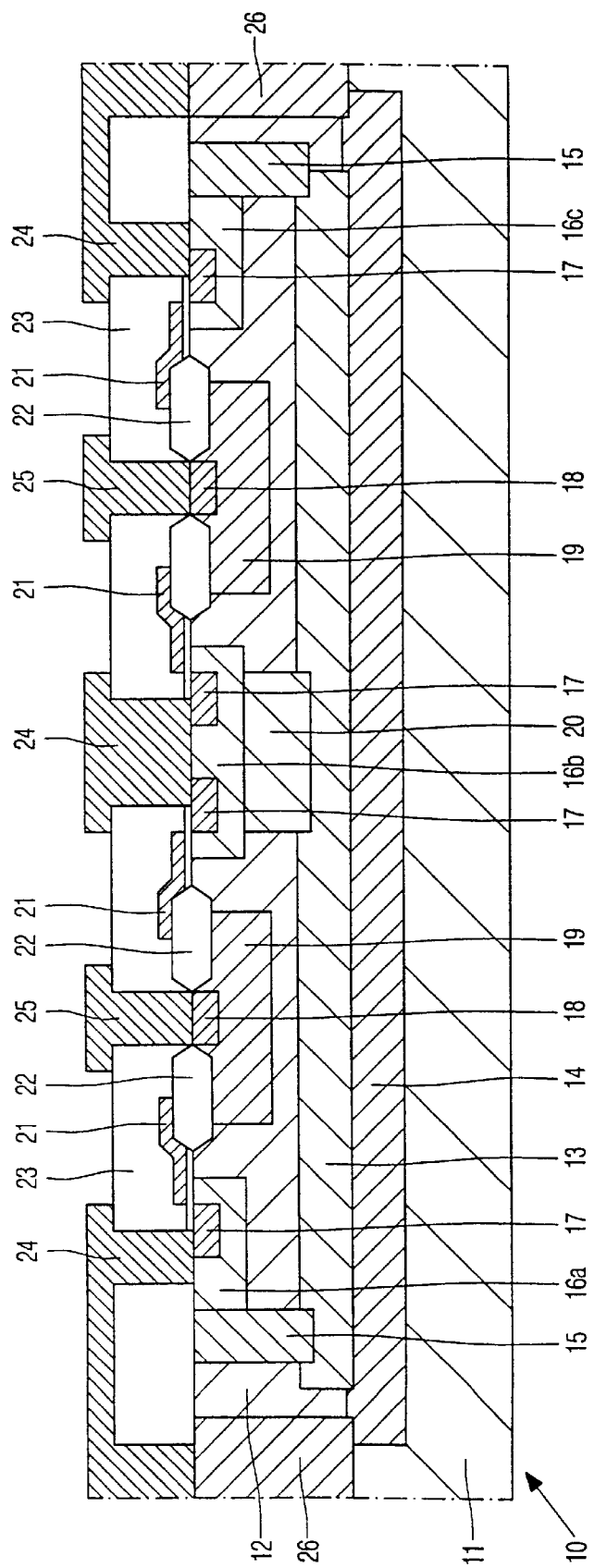
FIG. 2 is a sectional view of a semiconductor device in accordance with a first embodiment of the invention.

FIG. 2 is a sectional view of a first embodiment of an LDMOST in accordance with the invention. The device comprises a semiconductor body 10 which, in this case, is made of silicon but which may alternatively be made of another suitable semiconductor material. The semiconductor body 10 is composed of a substrate 11 of a first conductivity type, in this case the p-type, and of an epitaxial layer 12 of the second, opposite conductivity type, in this case the n-type, which is applied to the substrate. The semiconductor body further includes a p-type layered region, in this example a buried layer 13, which is situated near the interface of the substrate and the epi layer. The p-type buried layer 13 is separated from the p-type substrate 11 by an intermediate n-type buried layer 14 which in turn is isolated from the n-type epi layer by the p-type buried layer 13. In the epi layer 12, deep p-type isolation regions are formed which connect to the p-type buried layer 13 and, together with this buried layer, define an electrically insulated island in the epi layer. In this island, three mutually separated p-type surface regions 16a, 16b and 16c are provided, which form back-gate regions of the LDMOS transistor. The embodiment, shown in FIG. 2, comprises only three back-gate regions. Dependent upon the size of the current to be switched, it is of course possible that there are more than three back-gate regions. The source of the transistor is provided in the form of n-type surface regions 17, the two outermost back-gate regions 16a and 16c each including a single n-type doped region, while the central back-gate region 16b includes two n-type surface regions 17. The drain includes a number of heavily doped n-type surface regions 18 which are situated between the back-gate regions and within the semiconductor body in slightly doped n-type drain extensions 19. When use is made of an n-type epi layer having a suitable doping concentration, the drain extension may be formed by a part of the epi layer. In the present example, the drain extension is formed by a region formed in the epi layer.

In accordance with the invention, not only the back-gate regions 16a and 16c at the edge of the transistor, but also the back-gate regions within the transistor, i.e. in this example the region 16b, are connected by means of a p-type connection area 20 to the p-type buried layer 13.

The transistor further comprises a gate 21 of doped polysilicon, which is separated from the channel in the back-gate region by a relatively thin gate oxide, and which further extends as a field plate to beyond the drain extension, from which it is separated by relatively thick oxide 22. The surface of the device is covered with an electrically insulating layer 23, for example a glass layer. Via contact windows provided in this layer, the source and drain regions are connected to source contacts 24 and drain contacts 25, respectively. As is customary, the back-gate regions 16 are also connected to the source contact. In this example, the n-type buried layer 14 is also connected to the source via a deep n-type region 26 and the source contact 24, but it may alternatively be provided differently with a suitable voltage. The structure shown in the drawing can be isolated from other circuit elements in a customary manner by means of, for example, a deep p-type diffusion (not shown in the drawing), which extends from the surface down to the substrate 11 in the epi layer.

If this transistor is used as an LS transistor $T_2$ in the bridge circuit shown in FIG. 1, and the voltage on the drain 18, 19 becomes lower than the low supply voltage, it is prevented, as a result of the double buried layer 13 and 14, that charge carriers are injected into the substrate 11, in that the charge carriers are removed by the layer 14. The p-type well below the central back-gate region 16b also connects the most central parts of the p-type buried layer 13 to the back-gate region 16b and, via this region, which is short-circuited to the source, to the voltage supply $V_1$. As a result, the potential in the relatively high-ohmic p-type buried layer 13 is properly determined throughout said layer and equal or substantially equal to $V_1$. The above-described parasitic npn-action, which may occur in the absence of the p-type well 20 as a result of the relatively high resistance of the buried layer 13 is thus precluded in a simple manner.

Figure 3:
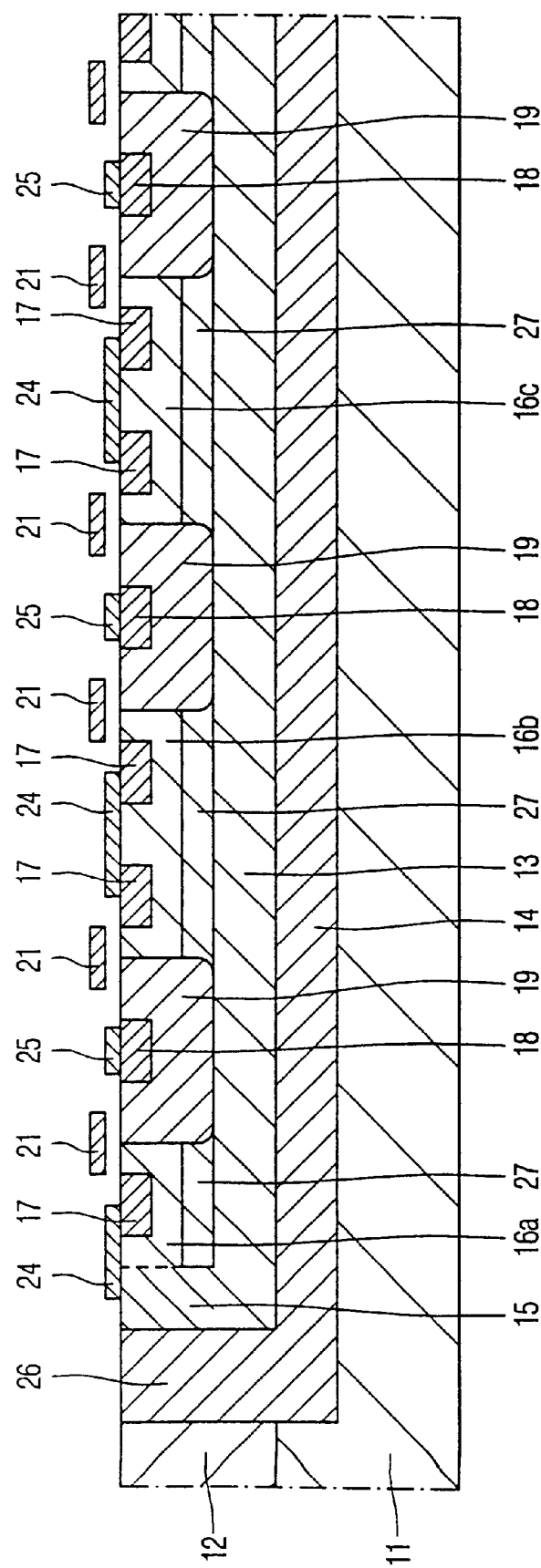
FIG. 3 is a sectional view of a semiconductor device in accordance with a second embodiment of the invention.

FIG. 3 schematically shows a variant of the embodiment shown in FIG. 2. For the sake of simplicity, corresponding parts in FIG. 3 bear the same reference numerals as in FIG. 2. In addition, certain parts which are not essential to the invention, such as the field oxide 22, are omitted and the gates and the contacts are shown only schematically. Apart from the number of back-gate regions, in this case more than three, the embodiment shown in FIG. 3 differs from the preceding embodiment by the presence of a p-type epi layer instead of an n-type epi layer 12. The conductivity types of the other regions are the same. The drift regions of the transistor comprise only the slightly doped n-type drain extensions 19 which extend maximally as far as the back-gate regions 16, so that parts 27 of the p-type epi layer remain below the back-gates 16. These parts of the epi layer connect the relatively high-ohmic p-type buried layer 13 and the back-gate regions 16 to each other and hence to the source contact 24, thereby precluding, in an effective manner, parasitic npn-action between the n-type buried layer 14 and the drain 18.

It will be obvious that the invention is not limited to the above-described examples, and that within the scope of the invention many variations are possible to those skilled in the art. For example, in a variant of the embodiment in accordance with FIG. 3, a suitably selected thickness and doping concentration of the epi layer enable the p-type buried layer 13 to be omitted, in which case said layered region of the first conductivity type, hence the p-type, is formed between the drain and the n-type buried layer by a part of the p-type epi layer. Further, in the examples described hereinabove, the conductivity types of the various regions may be reversed. The above-described combination of transistors $T_1$ and $T_2$ can also be used in circuits other than (half) bridge circuits, such as in power-conversion circuits.

What is claimed is:

1. A semiconductor device with a transistor of the lateral DMOS type, comprising a semiconductor body having a semiconductor substrate of a first conductivity type and, provided on the substrate, an epitaxial semiconductor layer bordering on a surface of the semiconductor body, said semiconductor body being provided, at the interface between the epitaxial layer and the substrate, with a layered region of the first conductivity type and a buried layer of a second, opposite, conductivity type, which extends between the layered region and the substrate and electrically insulates them from each other, at least three, mutually separated backgate regions of the first conductivity type, which border on the surface and are each provided with a source region of the second conductivity type, and a number of drain zones in the form of heavily doped surface regions of the second conductivity type, situated between the backgate regions and separated from said backgate regions by intermediate lightly doped drain extensions of the second conductivity type, being formed in a part of the epitaxial layer, situated between the buried layer and the surface, wherein the back-gate regions are each conductively connected to said layered region of the first conductivity type by means of a zone of the first conductivity type to at least substantially preclude bipolar transistor parasitic action.

2. A semiconductor device as claimed in claim 1, characterized in that the layered region of the first conductivity type is formed by a buried layer provided at the interface between the epitaxial layer and the substrate.

3. A semiconductor device as claimed in claim 2, characterized in that the epitaxial layer is of the same, i.e. the first, conductivity type as the substrate and that the drain region includes a number of mutually separated lightly doped regions which each form a drain extension which extends between adjoining back-gate regions of the first conductivity type, so that parts of the epitaxial layer between the back-gate regions and the buried layer of the first conductivity type remain which form a conductive connection between the back-gate regions and this buried layer.

4. A semiconductor device as claimed in claim 2, characterized in that the epitaxial layer is of the second conductivity type, said part in which the transistor is formed being electrically insulated from the buried layer by the buried layer of the first conductivity type, and a doped region of the first conductivity type being provided between each of the back-gate regions and the buried layer of the first conductivity type, said doped region of the first conductivity type forming a conductive connection between the back-gate region and the buried layer of the first conductivity type.

5. A semiconductor device as claimed in claim 1, characterized in that the substrate, the layered region and the back-gate regions are of the p-type, and the source and drain regions of the transistor are of the n-type.

6. A semiconductor device as claimed in claim 5, characterized in that the device includes a half bridge circuit with a first connection terminal for a high voltage and a second connection terminal for a low voltage, the source region of the transistor being connected to the connection terminal for the low voltage and the drain region of the transistor being connected to the source region of a second transistor whose drain region is connected to the first connection terminal.

* * * * *